US009691448B2

(12) United States Patent
Roh et al.

(10) Patent No.: US 9,691,448 B2
(45) Date of Patent: Jun. 27, 2017

(54) MEMORY SYSTEM HAVING LOWER PAGES AND UPPER PAGES PERFORMING STATUS READ OPERATION AND METHOD OF OPERATING THE SAME

(71) Applicant: SK hynix Inc., Gyeonggi-do (KR)

(72) Inventors: Young Dong Roh, Gyeonggi-do (KR); Sok Kyu Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/962,245

(22) Filed: Dec. 8, 2015

(65) Prior Publication Data
US 2016/0379689 A1   Dec. 29, 2016

(30) Foreign Application Priority Data
Jun. 26, 2015   (KR) .................. 10-2015-0090936

(51) Int. Cl.
| G06F 13/00 | (2006.01) |
| G11C 7/10 | (2006.01) |
| G06F 13/16 | (2006.01) |
| G11C 11/56 | (2006.01) |
| G11C 16/08 | (2006.01) |
| G11C 16/32 | (2006.01) |
| G11C 16/26 | (2006.01) |

(52) U.S. Cl.
CPC ........ G11C 7/1063 (2013.01); G06F 13/1673 (2013.01); G11C 11/5628 (2013.01); G11C 16/08 (2013.01); G11C 16/32 (2013.01); G11C 16/26 (2013.01); G11C 2211/5648 (2013.01)

(58) Field of Classification Search
CPC ............... G11C 7/1063; G11C 7/1072; G11C 2211/5642; G11C 2211/5621; G11C 2211/5641; G06F 13/1673; G06F 12/0246; G06F 2212/1024; G06F 3/0659; G06F 3/0679; G06F 3/0688
USPC .......... 365/185.01, 186.33, 185.03; 711/102, 711/103, 167, 158, 156
See application file for complete search history.

(56) References Cited

U.S. PATENT DOCUMENTS

| 2008/0037322 A1* | 2/2008 | Katayama ........... G11C 11/5621 365/185.03 |
| 2008/0189473 A1* | 8/2008 | Murray ............... G06F 12/0246 711/103 |
| 2009/0290414 A1* | 11/2009 | Hosono ............... G11C 11/5628 365/185.03 |
| 2012/0173792 A1* | 7/2012 | Lassa .................. G06F 9/4843 711/103 |

(Continued)

FOREIGN PATENT DOCUMENTS

KR   1020130073804   7/2013

*Primary Examiner* — Hong Kim
(74) *Attorney, Agent, or Firm* — IP & T Group LLP

(57) ABSTRACT

A method of operating a controller includes, determining whether an address corresponding to a program operation indicates a lower page or an upper page; waiting for a first waiting time for the program operation to the lower page when the address indicates the lower page; waiting for a second waiting time for the program operation to the upper page when the address indicates the upper page, wherein the second waiting time is longer than the first waiting time; and performing a status read operation on the semiconductor memory device after one of the first waiting time or the second waiting time.

18 Claims, 14 Drawing Sheets

(56) References Cited

U.S. PATENT DOCUMENTS

2012/0290768 A1* 11/2012 Rubowitz ........... G06F 12/0246
711/103

* cited by examiner

FIG. 8

| PHYSICAL PAGE | LSB PAGE | MSB PAGE |
|---|---|---|
| PPG1 | 00h | 02h |
| PPG2 | 01h | 04h |
| PPG3 | 03h | 06h |
| PPG4 | 05h | 08h |
| PPG5 | 07h | 0Ah |
| PPG6 | 09h | 0Ch |
| PPG7 | 0Bh | 0Eh |
| PPG8 | 0Dh | 10h |
| PPG9 | 0Fh | 12h |
| PPG10 | 11h | 14h |
| PPG11 | 13h | 16h |

⋮

| PPG121 | EFh | F2h |
|---|---|---|
| PPG122 | F1h | F4h |
| PPG123 | F3h | F6h |
| PPG124 | F5h | F8h |
| PPG125 | F7h | FAh |
| PPG126 | F9h | FCh |
| PPG127 | FBh | FEh |
| PPG128 | FDh | FFh |

MEMORY SYSTEM HAVING LOWER PAGES AND UPPER PAGES PERFORMING STATUS READ OPERATION AND METHOD OF OPERATING THE SAME

CROSS-REFERENCE TO RELATED APPLICATION

The present application claims priority to Korean patent Application No. 10-2015-0090936, filed on Jun. 26, 2015, the entire disclosure of which is herein incorporated by reference in its entirety.

BACKGROUND

1. Field

An aspect of the present disclosure relates to an electronic device, and more particularly, to a memory system performing status read operation and a method of operating the same.

2. Description of the Related Art

A semiconductor memory device is a memory device implemented using a semiconductor such as silicon (Si), germanium (Ge), gallium arsenide (GaAs), or indium phosphide (InP). The semiconductor memory device is generally classified into a volatile memory device and a nonvolatile memory device.

The volatile memory is a memory device which loses stored data when a power supply is cut off. Examples of the volatile memory include a static random access memory (SRAM), a dynamic RAM (DRAM), a synchronous DRAM (SDRAM), and the like. The nonvolatile memory is a memory device which retains stored data even when a power supply is cut off. Examples of the nonvolatile memory include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. The flash memory is generally classified into a NOR type flash memory and a NAND type flash memory.

SUMMARY

Embodiments provide a memory system with improved operation speed and reduced power consumption, and a method of operating the same.

According to an aspect of the present disclosure, there is provided a method of operating a controller, the method including determining whether an address corresponding to a program operation indicates a lower page or an upper page; waiting for a first waiting time for the program operation to the lower page when the address indicates the lower page; waiting for a second waiting time for the program operation to the upper page when the address indicates the upper page, wherein the second waiting time is longer than the first waiting time; and performing a status read operation on the semiconductor memory device after one of the first waiting time or the second waiting time.

According to an aspect of the present disclosure, there is provided a memory system including a semiconductor memory device including a plurality of physical pages; and a controller including a memory controller suitable for commanding a program operation on the semiconductor memory device; and a status read command generator suitable for: waiting for a first waiting time for the program operation to the lower page when an address corresponding to the program operation indicates the lower page; waiting for a second waiting time for the program operation to the upper page when the address indicates the upper page, wherein the second waiting time is longer than the first waiting time; and performing a status read operation on the semiconductor memory device after one of the first waiting time or the second waiting time.

According to another aspect of the present disclosure, there is provided a memory system including: first and second memory devices connected to one channel among a plurality of channels, the first and second memory devices each including a plurality of pages; and a controller including a memory controller suitable for commanding first and second program operations on the first and second semiconductor memory devices, respectively; and a status read command generator suitable for: waiting for a first waiting time for the first program operation to the lower page when a first address corresponding to the first program operation indicates the lower page; waiting for a second waiting time for the first program operation to the upper page when the first address indicates the upper page, wherein the second waiting time is longer than the first waiting time; performing a status read operation on the first semiconductor memory device after one of the first and second waiting times for the first program operation; waiting for the first waiting time for the second program operation to the lower page when a second address corresponding to the second program operation indicates the lower page; waiting for the second waiting time for the second program operation to the upper page when the second address indicates the upper page; and performing the status read operation on the second semiconductor memory device after one of the first or second waiting times for the second program operation.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 8 is a table illustrating page addresses of first to 128th physical pages.

DETAILED DESCRIPTION

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 1:
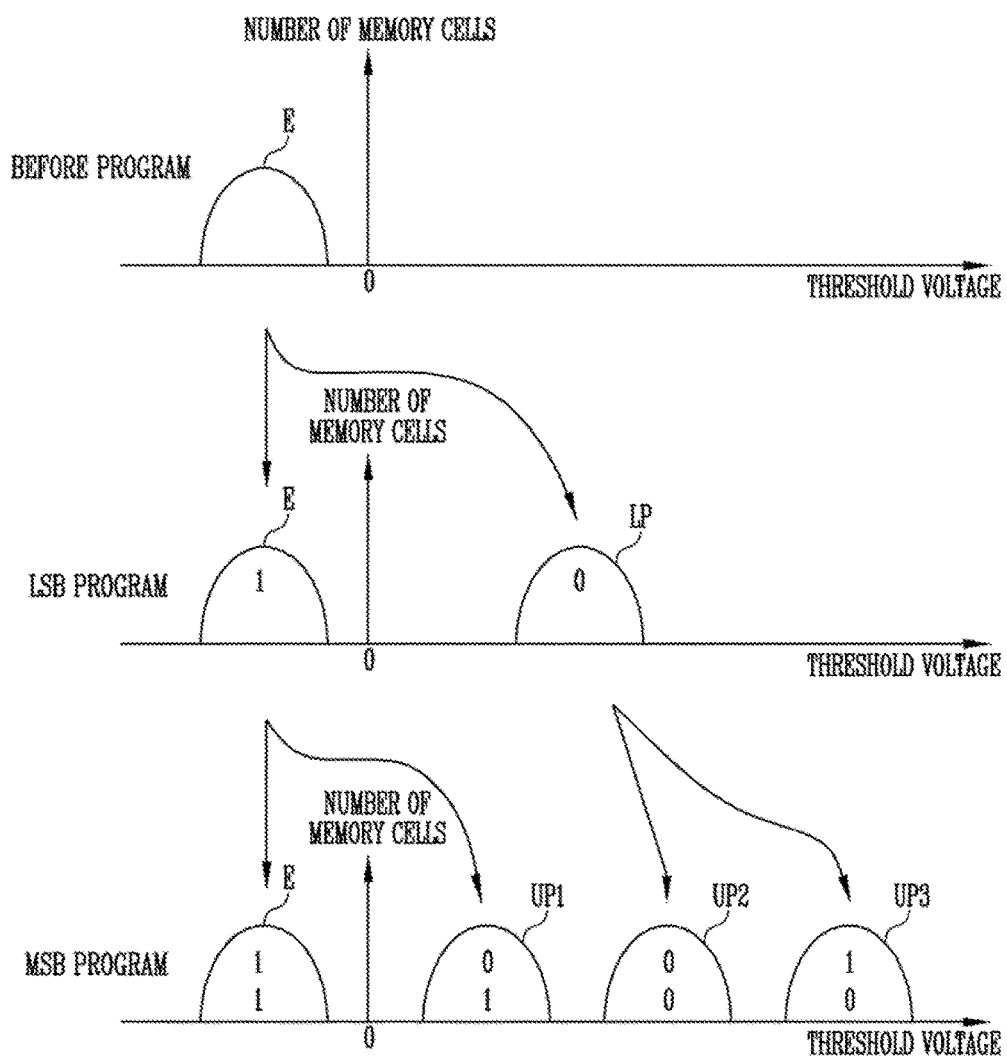
FIG. 1 is a diagram illustrating distributions of threshold voltages of selected memory cells during a program operation on least significant bit (LSB) page and a most significant bit (MSB) page.

FIG. 1 is a diagram illustrating distributions of threshold voltages of selected memory cells during a program operation on least significant bit (LSB) page and a most significant bit (MSB) page. In FIG. 1, the horizontal axis represents threshold voltages of memory cells, and the vertical axis represents numbers of memory cells.

Referring to FIG. 1, before a program operation is performed, selected memory cells have an erase state E. For example, the range of voltages corresponding to the erase state E may be lower than a ground voltage.

First, a program operation on an LSB page is performed. During the LSB program operation, the memory cells in the erase state E are programmed to have the erase state E or a lower program state LP. In an example, it may be defined that the memory cells in the erase state E store a logic value of "1" and the memory cells in the lower program state LP store a logic value of "0." Accordingly, each memory cell stores a single data bit. The data bits of the memory cells may constitute the LSB page. A corresponding physical page includes a single LSB page.

Subsequently, a program operation on an MSB page is performed. It is assumed that each memory cell is defined as a multi-level cell capable of storing two bits. During the MSB program operation, the memory cells in the erase state E may be programmed to the erase state E and a first upper program state UP1, and the memory cells in the lower program state LP may be programmed to have a second upper program state UP2 and a third upper program state UP3. To this end, the LSB page of the selected memory cells is first read, and the MSB program operation is performed on the basis of the read LSB page.

As an embodiment, the erase state E may correspond to data "11," the first upper program state UP1 may correspond to data "01," the second upper program state UP2 may correspond to data "00," and the third upper program state UP3 may correspond to data "10." In other words, the LSB bits of the erase state and the first to third upper program states UP1 to UP3 may be defined as "1," "1," "0," and "0," respectively, and the MSB bits of the erase state and the first to third upper program states UP1 to UP3 may be defined as "1," "0," "0," and "1," respectively.

Accordingly, another single data bit is additionally stored in each memory cell. Each memory cell may store two bits. The LSB bits of the memory cells may constitute the LSB page. The MSB bits of the memory cells may constitute the MSB page. A corresponding physical page includes the LSB page and the MSB page.

Upon recognition of completion of the program operation, the controller may transmit a next command to the semiconductor memory device. The recognition of completion is achieved by status read operation on the semiconductor memory device. Quick recognition of completion causes reduced access time to the program operation. However, the repetitive status read operations during the program operation of the semiconductor memory device cause the power consumption of a memory system to increase.

Meanwhile, during the LSB program operation, the semiconductor memory device performs a program operation on the selected memory cells. On the other hand, during the MSB program operation, the semiconductor memory device first reads an LSB page of the selected memory cells, and performs a MSB program operation based on the read LSB page. For at least this reason, the MSB program operation requires a longer time than the LSB program operation. For example, about 400 µs (microsecond) is required for the LSB program operation, and about 1400 µs (microsecond) is required for the MSB program operation. When each memory cell is defined as a triple-level cell, the time required in the MSB program operation may further increase. That is, the program operation on an upper page requires a longer time than the program operation on a lower page.

Thus, it is preferable to perform status read operation at different operation times between the LSB and MSB programs. A read operation time is much shorter than a program operation time. Therefore, the difference of the operation times between the MSB program operation and the LSB program operation may be greater than the difference of the operation times between the LSB program operation and the read operation. For example, about 40 µs may be required for the read operation. The status read operation at different operation timings between the LSB and MSB programs may improve the access time and power consumption of the memory system.

Figure 2:
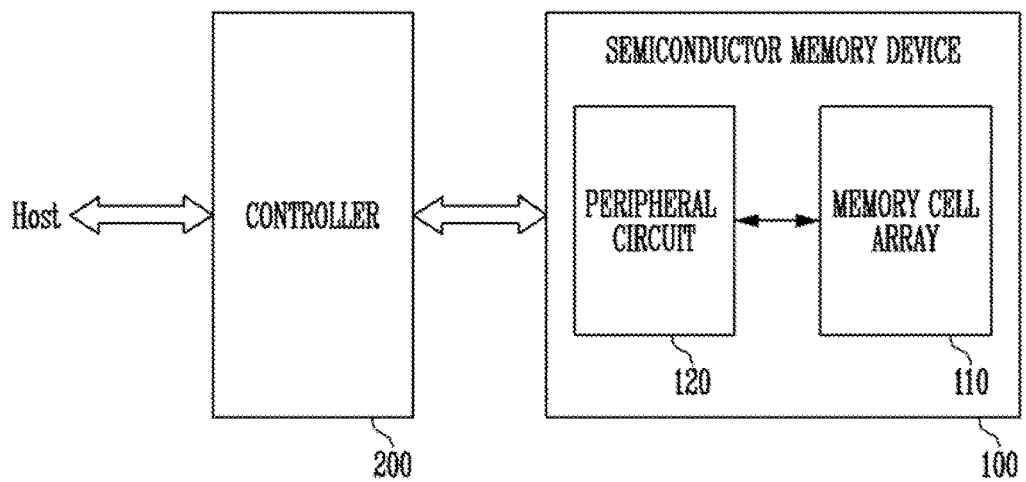
FIG. 2 is a block diagram illustrating a memory system according to an embodiment of the present disclosure.

FIG. 2 is a block diagram illustrating a memory system 1000 according to an embodiment of the present disclosure.

Referring to FIG. 2, the memory system 1000 includes a semiconductor memory device 100 and a controller 200.

The semiconductor memory device 100 operates under the control of the controller 200. The semiconductor memory device 100 may be provided as an Integrated circuit to one or more chips. As an example, the semiconductor memory device 100 may be a nonvolatile memory device.

The semiconductor memory device 100 includes a memory cell array 110 and a peripheral circuit 120. The memory cell array 110 includes a plurality of memory blocks. Each memory block includes a plurality of physical pages. Each physical page includes memory cells connected to one word line.

The peripheral circuit 120 receives commands and addresses from the controller 200 to perform a program operation, a read operation, an erase operation, and the like on the memory cell array 110. When the program operation is performed, the peripheral circuit 120 may receive program data to be programmed from the controller 200 and store the data to be programmed in a physical page indicated by an address. The address corresponding to the program operation may include a block address for selecting one memory block and a page address for selecting one physical page. When the read operation is performed, the peripheral circuit 120 may read data stored in a physical page indicated by an address and output the read data to the controller 200. The address corresponding to the read operation may include a block address for selecting one memory block and a page address for selecting one physical address. When the erase operation is performed, the peripheral circuit 120 may erase data stored in a memory block indicated by an address. The address corresponding to the erase operation may include a block address for selecting one memory block.

The controller 200 is connected between a host (Host) and the semiconductor memory device 100. The controller 200 may command the semiconductor memory device 100 in response to a request from the host Host. The controller 200 may control the semiconductor memory device 100 to perform a program operation, a read operation, an erase operation, or the like. When the program operation is performed, the controller 200 may provide, to the semiconductor memory device 100, a command (hereinafter, referred to as a program command) corresponding to the program operation, an address, and data to be programmed. The semiconductor memory device 100 may store data in a physical phase indicated by the address. When the read operation is performed, the controller 200 may provide, to the semiconductor memory device 100, a command (hereinafter, referred to as a read command) corresponding to the read operation and an address. The semiconductor memory device 100 may read data from a physical page indicated by the address and output the read data to the controller 200. When the erase operation is performed, the controller 200 may provide, to the semiconductor memory device 100, a command (hereinafter, referred to as an erase command) corresponding to the erase operation and an address. The semiconductor memory device 100 may erase data stored in a memory block indicated by the address.

The controller 200 commands the semiconductor memory device 100 and then performs the status read operation on the semiconductor memory device 100. According to the embodiment of the present disclosure, the controller 200 performs the status read operation on the semiconductor memory device 100 after different waiting times during the LSB and MSB program operations. This will be described in detail with reference to FIG. 3.

During the status read operation, the controller 200 may transmit a status read command to the semiconductor memory device 100, and the semiconductor memory device 100 may transmit a status read response signal as a response to the status read command to the controller 200. For example, the status read response signal having a first status value may represent the current program operation in progress while the status read response signal having a second status value may represent completion of the current program operation. When the performance of the corresponding command is completed, the controller 200 may transmit a next command to the semiconductor memory device 100.

Figure 3:
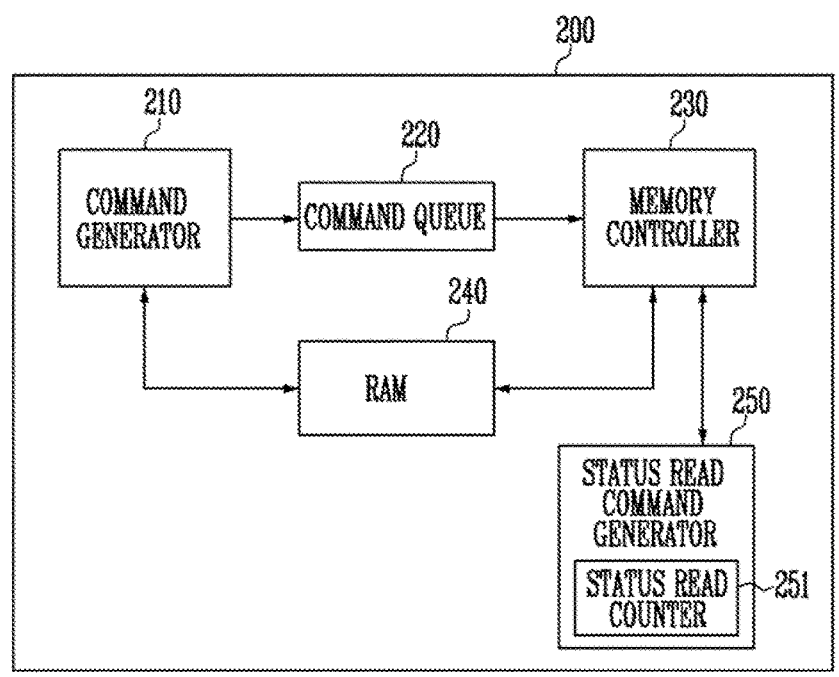
FIG. 3 is a block diagram illustrating a controller of FIG. 2.

FIG. 3 is a block diagram illustrating the controller 200 of FIG. 2.

Referring to FIGS. 2 and 3, the controller 200 includes a command generator 210, a command queue 220, a memory controller 230, a RAM 240, and a status read command generator 250.

The command generator 210 is coupled to the command queue 220 and the RAM 240. The command generator 210 may control general operations of the controller 200.

When a request is received from the host Host, the command generator 210 may generate a command corresponding to the corresponding request. As an embodiment, the command generator 210 may perform a function of a flash translation layer. The command generator 210 may convert a logical block address included in the request from the host Host into a physical block address. The command generator 210 may store the command and the physical block address in the RAM 240. A single command set includes the command and the physical block address. The command set stored in the RAM 240 may be transmitted to the semiconductor memory device 100 by the memory controller 230.

The command generator 210 may generate a command and a physical block address for itself without any request from the host Host, and store a command set including the command and the physical block address in the RAM 240. For example, the command generator 210 may generate a command set so as to perform background operations such as program and read operations for wear leveling or program and read operations for garbage collection, and store the generated command set in the RAM 240.

The command generator 210 stores an index in the command queue 220. The index corresponds to the command set stored in the RAM 240. The index may include an address in the RAM 240 in which the command set is stored. The memory controller 230 may acquire an index stored in the command queue 220, read a corresponding command set from the RAM 240 with reference to the address in the RAM 240, included in the index, and transmit the read command set to the semiconductor memory device 100.

The command queue 220 operates on the first-in-first-out (FIFO) basis. The inputting of the indexes to the command queue 220 may be performed by the command generator 210. The outputting of the indexes from the command queue 220 may be performed by the memory controller 230. When an index is input to the command queue, a corresponding command set is input to the RAM 240. When an index is output from the command queue, a corresponding command set is output from the RAM 240. This means that command sets in the RAM 240 are input/output on the FIFO basis.

The status read command generator 250 is connected to the memory controller 230. The status read command generator 250 is configured such that the memory controller 230 performs the status read operation once or more between outputs of the command sets. After the command set is output such that the semiconductor memory device 100 is commanded, the status read command generator 250 may generate the status read command. The generated status read command may be provided to the semiconductor memory device 100 through the memory controller 230. In FIG. 3, the status read command generator 250 is separated from the memory controller 230, but this is for illustrative purposes. The status read command generator 250 may be included in the memory controller 230.

According to the embodiment of the present disclosure, the status read command generator 250 includes a status read counter 251. The status read command generator 250 may set a value of the status read counter 251 to a specific reference value according to the command set output from the memory controller 230 to the semiconductor memory device 100. After the command set is output such that the semiconductor memory device 100 is commanded, the status read counter 251 may count the value thereof up to the set reference value and then generate an alarm signal. The status read command generator 250 may generate the status read command in response to the generated alarm signal.

The status read command generator 250 acquires an address, particularly, a page address included in the command set when a program operation is commanded to the semiconductor memory device 100. The status read command generator 250 determines whether the acquired address indicates a lower page or an upper page.

Hereinafter, each memory cell in the semiconductor memory device 100 is defined as a multi-level cell capable of storing two bits, and it is assumed that the lower page is an LSB page and the upper page is an MSB page. However, the present disclosure is not limited thereto. For example, when each memory cell is a triple-level cell capable of storing three bits, the lower page may be an LSB page and the upper page may be a central significant bit (CSB) page. Alternatively, the lower page may be a CSB page and the upper page may be an MSB page.

When the address indicates the LSB page, the status read command generator 250 performs the status read operation after a first waiting time. The first waiting time may be equal to or shorter than the LSB program operation time. When the address indicates the MSB page, the status read command generator 250 waits for a second waiting time longer than the first waiting time. The second waiting time may be equal to or shorter than the MSB program operation time, and equal to or longer than the LSB program operation time.

When the address indicates the LSB page, the status read command generator 250 may set the value of the status read counter 251 to a first reference value. In this case, the status read counter 251 may count up to the first reference value and then generate the alarm signal. The time required to count up to the first reference time may corresponding to the first waiting time. When the address indicates the MSB page, the status read command generator 250 may set the value of the status read counter 251 to a second reference value greater than the first reference value. In this case, the status read counter 251 may count up to the second reference value and then generate an alarm signal. The time required to count up to the second reference time may correspond to the second waiting time.

Figure 4:
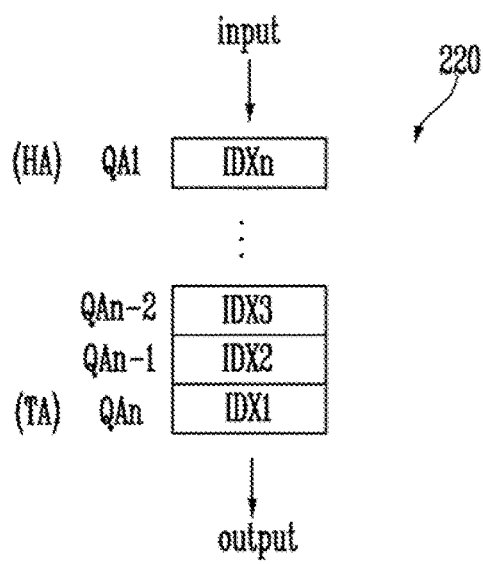
FIG. 4 is a diagram illustrating indexes stored in a command queue of FIG. 3.

FIG. 4 is a diagram illustrating indexes stored in the command queue 220 of FIG. 3.

Referring to FIG. 4, indexes IDX1 to IDXn are stored in first to nth queue addresses QA1 to QAn of the command queue 220. The first queue address QA1 is a head address HA. The nth queue address QAn is a tail address TA.

The command queue 220 operates on the FIFO basis. It is assumed that first to nth indexes IDX1 to IDXn are sequentially input. The first to nth indexes IDX1 to IDXn may be sequentially stored from the tail address TA to the head address HA. In FIG. 4, the first to nth indexes IDX1 to IDXn are stored in the nth to first queue addresses QAn to QA1, respectively. An input index is stored into the head address HA, and an index stored in the tail address TA is output.

Each index may include an address in the RAM 240. The address in the RAM 240 may indicate a corresponding command set.

Figure 5:
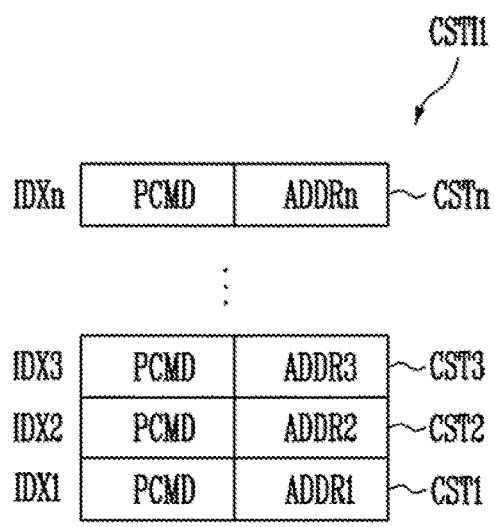
FIG. 5 is a diagram illustrating command set information stored in a RAM of FIG. 3.

FIG. 5 is a diagram illustrating command set information stored in the RAM 240 of FIG. 3.

Referring to FIG. 5, the command set information CSTI1 includes first to nth command sets CST1 to CSTn. Each of the first to nth command sets CST1 to CSTn includes a program command PCMD. The first to nth command sets CST1 to CSTn include first to nth addresses ADDR1 to ADDRn, respectively. The address ADDR indicates a physical block address corresponding to the semiconductor memory device 100.

In FIG. 5, it is illustrated that the command set information CSTI1 includes the program commands PCMD and does not include commands of other types (e.g., a read command and an erase command). However, it will be understood that the command set information CSTI1 may additionally include commands of other types.

The first to nth command sets CST1 to CSTn correspond to the first to nth indexes IDX1 to IDXn, respectively. When an index is output from the command queue 220, the memory controller 230 may read from the RAM 240 a command set corresponding to the output index, and output the command set, which is read from the RAM 240, to the semiconductor memory device 100.

It will be understood that when each of the first to nth command sets CST1 to SCTn is output to the semiconductor memory device 100, data to be programmed may be further transmitted to the semiconductor memory device 100. For example, data to be programmed corresponding to each command set may be stored in the RAM 240, and the memory controller 230 may output, to the semiconductor memory device 100, the data to be programmed together with the command set.

Figure 6:
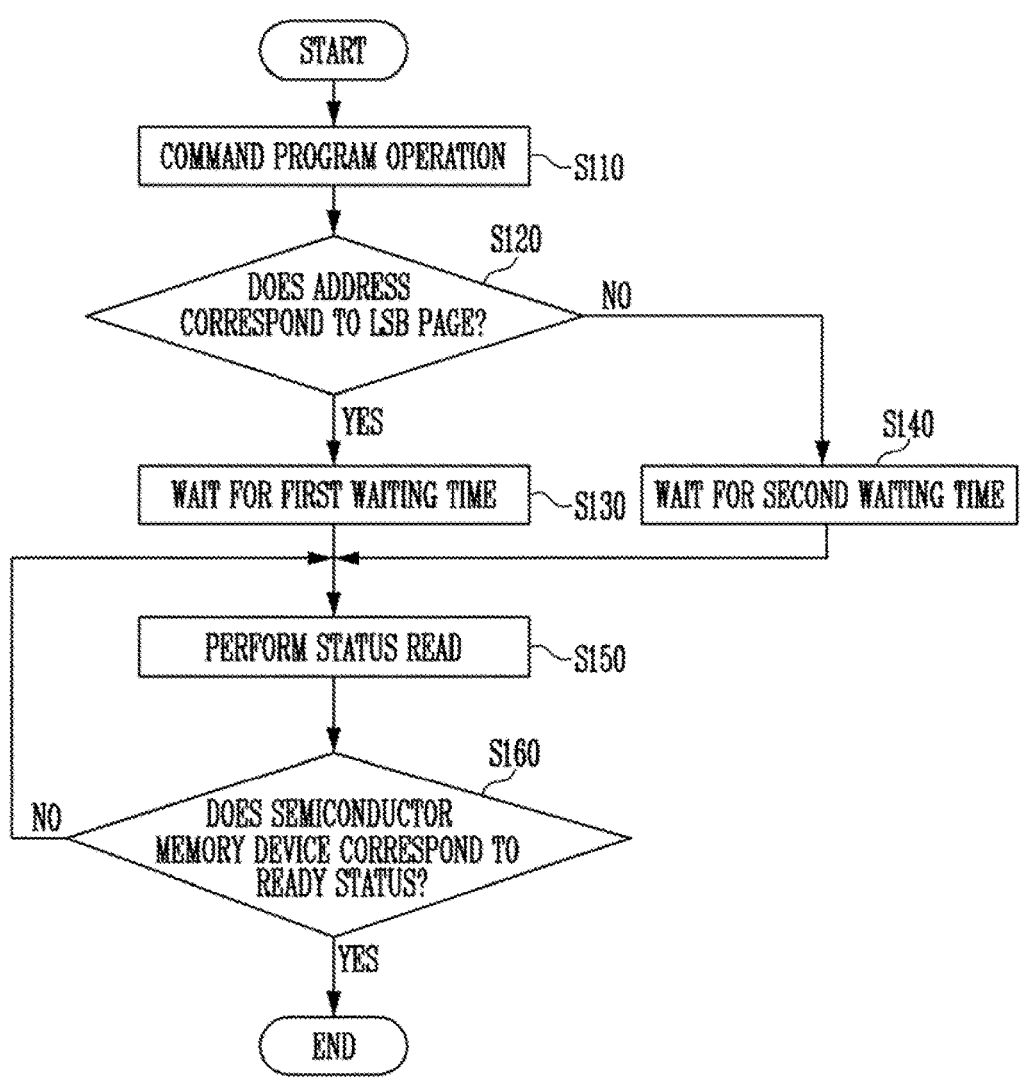
FIG. 6 is a flowchart illustrating an operating method of the controller according to an embodiment of the present disclosure.

FIG. 6 is a flowchart illustrating an operating method of the controller 200 according to an embodiment of the present disclosure.

Referring to FIGS. 2, 3 and 6, at step S110, the controller 200 commands a program operation. At step S120, the controller 200 determines whether an address for the program command corresponds to the LSB page or the MSB page. The status read command generator 250 may acquire the address included in the command set for the program operation, and determine whether the acquired address corresponds to the LSB page or the MSB page. In this case, the address may mean the page address. When the address included in the command set corresponds to the LSB page, step S130 is performed. When the address included in the command set corresponds to the MSB page, step S140 is performed.

At step S130, the controller 200 commands a program operation and waits for the first waiting time. In this case, the status read command generator 250 performs the status read operation after the first waiting time. In other words, the controller 200 may perform other internal operations during the first waiting time. The status read command generator 250 may set the value of the status read counter 251 to the first reference value. The status read counter 251 may count up to the first reference value and then generate the alarm signal. The time required to count up to the first reference value may be the first waiting time.

At step S140, the controller 200 commands a program operation and then waits for the second waiting time longer than the first waiting time. In this case, the status read command generator 250 performs the status read operation after the second waiting time. In other words, the controller 200 may perform other internal operations during the second waiting time. The status read command generator 250 may set the value of the status read counter 251 to the second reference value. The status read counter 251 may count up to the second reference value and then generate the alarm signal. The time required to count up to the second reference value may be the second waiting time. The second waiting time may be equal to or shorter than the MSB program operation time and longer than the LSB program operation time.

At step S150, the controller 200 performs status read operation. The status read command generator 250 generates the status read command in response to the alarm signal. The generated status read command is transmitted to the semiconductor memory device 100. The semiconductor memory device 100 may transmit the status read response signal as a response to the status read command to the controller 200.

At step S160, it is determined whether the semiconductor memory device 100 corresponds to a ready status according to the status read operation. When the semiconductor memory device 100 corresponds to the ready status means that the semiconductor memory device 100 has completed the program operation of step S110. When the semiconductor memory device 100 corresponds to a busy status means that the semiconductor memory device 100 does not complete the program operation of step S110. When the semiconductor memory device 100 corresponds to the busy status, step S150 is re-performed.

Figure 7:
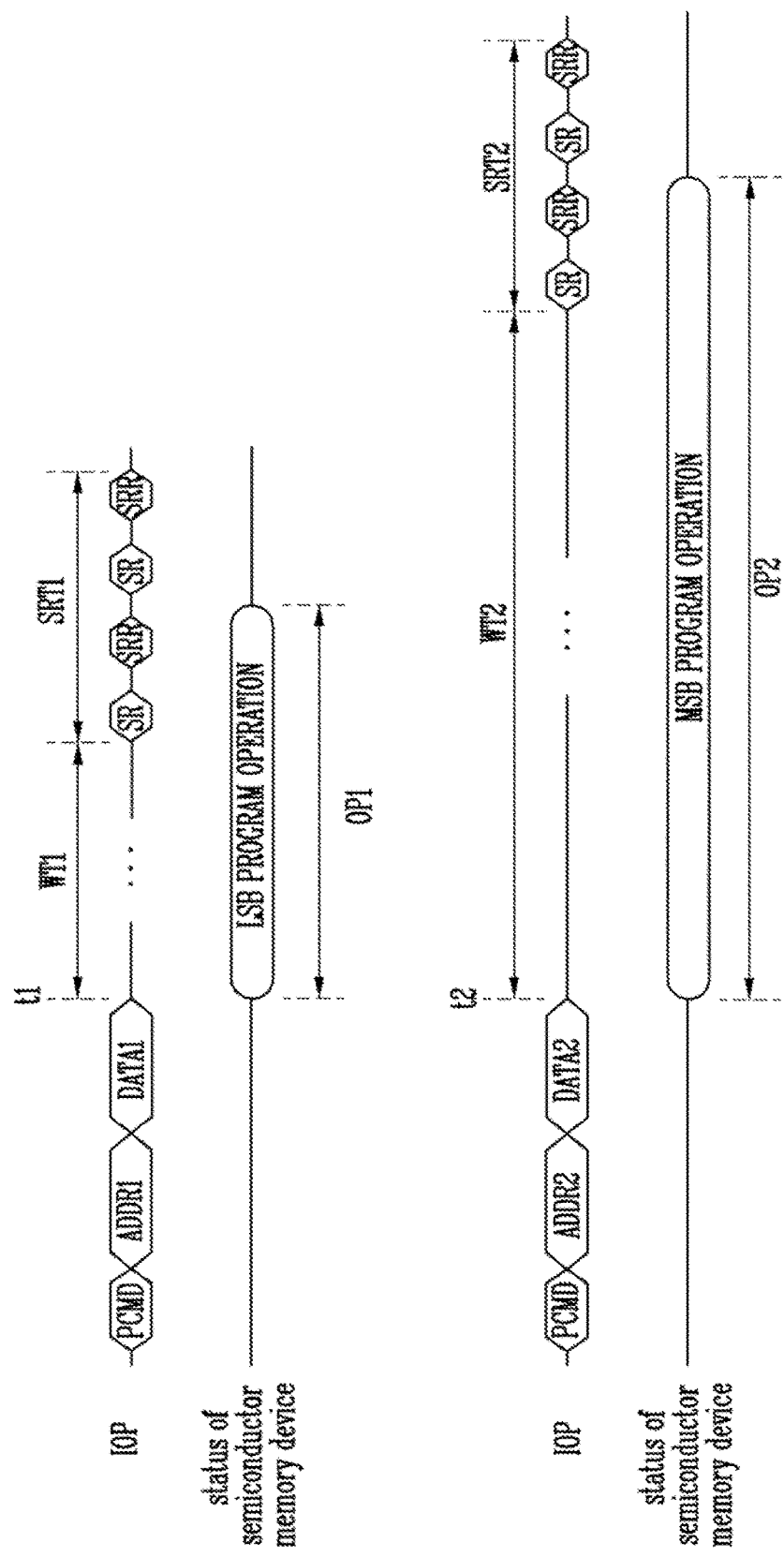
FIG. 7 is a timing diagram illustrating the operating method of FIG. 6.

FIG. 7 is a timing diagram illustrating the operating method of FIG. 6.

Referring to FIG. 7, a program command PCMD, an address ADDR1, and data DATA1 to be programmed are transmitted to the semiconductor memory device 100 through input/output pins IOP to command the LSB program operation. In this case, it will be understood that the controller 200 may further transmit additional information to command the LSB program operation, in addition to the program command PCMD, the address ADDR1, and the data DATA1. In FIG. 7, a first time t1 refers to a point of time when the commanding of the LSB program operation is completed.

The semiconductor memory device 100 may perform the LSB program after the first time t1. The semiconductor memory device 100 may store the data DATA1 in the LSB page indicated by the address ADDR1. The LSB program operation may be performed for a first required time OP1.

Meanwhile, the controller 200 waits for the first waiting time WT1 from the first time t1. After the first waiting time WT1 elapses, the controller 200 performs status read operation at least once during a first status read period SRT1. The controller 200 may transmit the status read signal SR to the semiconductor memory device 100. The semiconductor memory device 100 may transmit the status read response signal SRR to the controller 200 in response to the status read signal SR. The communication of the status read signal SR and the status read response signal SRR is performed through the input/output pins IOP. When the status read response signal SRR corresponds to the busy status, the controller 200 may re-perform the status read operation. When the status read response signal SRR corresponds to the ready status, the controller 200 is no longer performing the status read operation. In FIG. 7, it is illustrated that the status read operation is performed twice.

The sum of the first waiting time WT1 and the first status read period STR1 may correspond to an access time to the LSB program operation.

A program command PCMD, an address ADDR2, and data DATA2 to be programmed are transmitted to the semiconductor memory device 100 through the input/output pins IOP to command an MSB program. In this case, it will be understood that the controller 200 may further transmit additional information to command the MSB program operation, in addition to the program command PCMD, the address ADDR2, and the data DATA2. In FIG. 7, a second time t2 refers to a point of time when the commanding of the MSB program operation is completed.

The semiconductor memory device 100 may perform the MSB program operation after the second time t2. The semiconductor memory device 100 may store the data DATA2 in the MSB page indicated by the address ADDR2. The MSB program operation may be performed for a second required time OP2. The second required time OP2 is longer than the first required time OP1.

The controller 200 waits for the second waiting time WT2 from the second time t2. The second waiting time WT2 is longer than the first waiting time WT1 and the first required time OP1. After the second waiting time WT2 elapses, the controller 200 performs status read operation at least once during a second status read period SRT2. In FIG. 7, it is illustrated that the controller 200 performs the status read operation twice.

The sum of the second waiting time WT2 and the second status read period SRT2 may correspond to an access time to the MSB program operation.

It is contemplated that any waiting time may not be applied, and the status read operation may be repeatedly performed just after the program operation is commanded. The repetition of the status read operation increases the power consumption of the memory system 1000, and a large amount of load is caused in the throughput of the controller 200.

It is contemplated that a common waiting time may be applied when the LSB program operation and the MSB program operation are performed. For example, the common waiting time may be an average value of the first required time OP1 and the second required time OP2. During the LSB program operation, the status read operation may be performed after the common waiting time, which is longer than the first required time OP1 from the first time t1. Although the LSB program operation has already been completed, the status read operation may not be performed for a certain time. This means that the access time to the LSB program operation increases. During the MSB program operation, the status read operation may be performed after the common waiting time, which is shorter than the second waiting time WT2 from the second time t2. The status read operation may be performed any number of times. This means that the power consumption of the memory system 1000 increases, and a large amount of load is caused in the throughput of the controller 200.

According to the embodiment of the present disclosure, when the address for the program operation indicates the LSB page, the short first waiting time is applied before the status read operation is performed. When the address for the program operation indicates the MSB page, the long second waiting time is applied before the status read operation is performed. Accordingly, the amount of load where the status read operation has influence on the throughput of the controller 200 can be reduced, and the power consumption of the memory system 1000 can be reduced. Further, the access time to each of the LSB program operation and the MSB program operation can be reduced. Thus, the operation speed of the memory system 1000 can be improved, and the power consumption of the memory system 1000 can be reduced.

FIG. 8 is a table illustrating page addresses of first to 128th physical pages. In FIG. 8, each page address is expressed by hexadecimal numbers.

Referring to FIG. 8, zeroth to 255th page addresses '00h' to 'FFh' are provided. In order to reduce disturbance between adjacent physical pages, an LSB page of a qth page PPGq may be programmed, and an MSB page of a (q−1)th page PPGq-1 may be programmed (q is a natural number which is greater than 1 and less than or equal to 128). As a result, the page addresses '00h' to 'FFh' may be assigned to physical pages PPG1 to PPG128 as shown in the table of FIG. 8, and a program operation may be performed on the physical pages PPG1 to PPG128 with an increasing order of the page address PPG1 to PPG128.

When the page addresses '00h' to 'FFh' are assigned to physical pages PPG1 to PPG128 as shown in the table of FIG. 8, the zeroth page address '00h' and odd page addresses '01h' to 'FDh' indicate the LSB page. In other words, the minimum value '00h' and the odd page addresses '01h' to 'FDh' among the page addresses '00h' to 'FFh' indicate the LSB page.

When the page addresses '00h' to 'FFh' are assigned to physical pages PPG1 to PPG128 as shown in the table of FIG. 8, the 255th page address 'FFh' and even page addresses '02h' to 'FFh' indicate the MSB page. In other words, the maximum value 'FFh' and the even page addresses '02h' to 'FFh' among the page addresses '00h' to 'FFh' indicate the MSB page.

Figure 9:
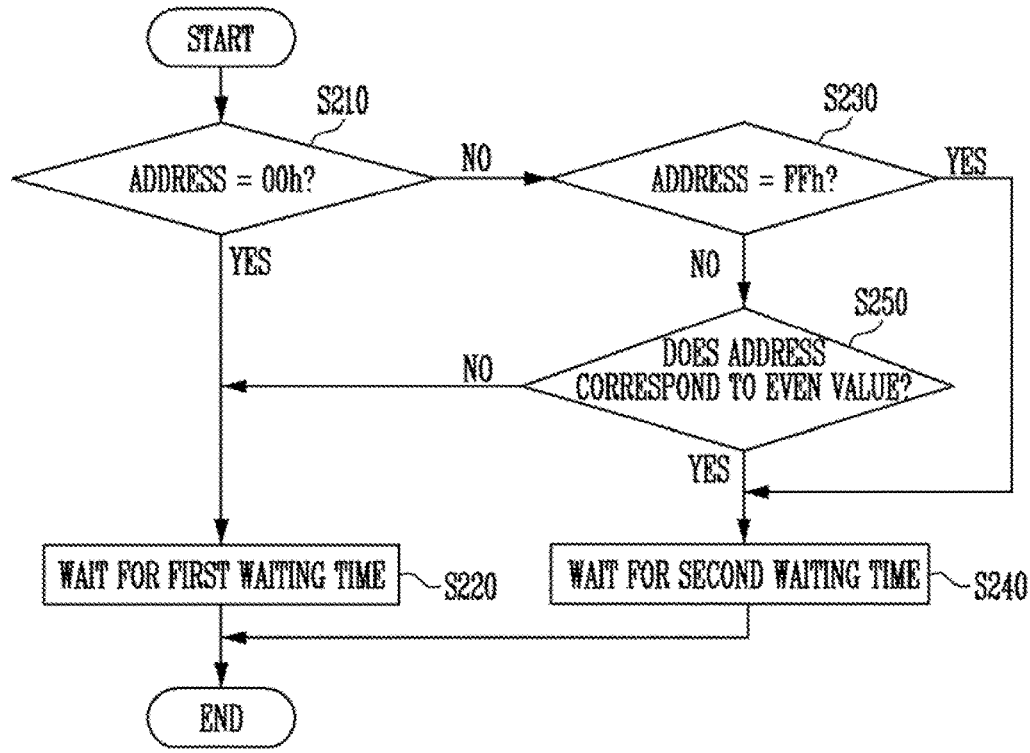
FIG. 9 is a flowchart illustrating an embodiment of steps S120 to S140 of FIG. 6.

FIG. 9 is a flowchart illustrating an embodiment of steps S120 to S140 of FIG. 6. Steps S120 corresponds to step S210, S230 and S250 of FIG. 9. Steps S130 and S140 are similar to steps S220 and S240 of FIG. 9, respectively.

Referring to FIG. 9, at step S210, it is determined whether the address is the zeroth page address '00h'. If so, the address corresponds to the LSB page and thus step S220 or step S130 is performed.

At step S230, if the address is not the zeroth page address '00h,' it is determined whether the address is the 255th page address 'FFh'. If so, the address corresponds to the MSB page and thus step S240 or step S140 is performed.

At step S250, it is determined whether the address corresponds to an even value. If so, the address corresponds to the MSB page and thus step S240 or step S140 is performed. If the address corresponds to an odd value, the address corresponds to the LSB page and thus step S220 or step S130 is performed.

Figure 10:
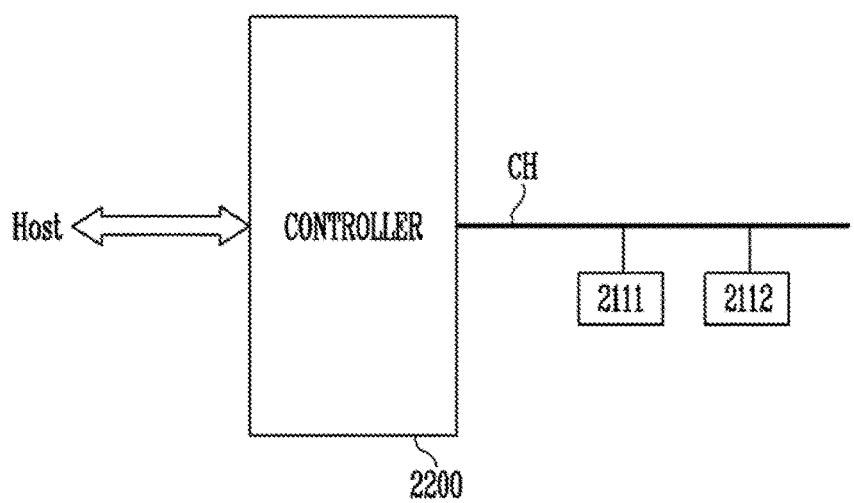
FIG. 10 is a block diagram illustrating a memory system according to an embodiment of the present disclosure.

FIG. 10 is a block diagram illustrating a memory system 2000 according to an embodiment of the present disclosure.

Referring to FIG. 10, the memory system 2000 includes a plurality of semiconductor memory devices 2111 and 2112 and a controller 2200.

Each of first and second semiconductor memory devices 2111 and 2112 may be configured and operated similarly to the semiconductor memory device 100 described with reference to FIG. 2. The controller 2200 may control the first and second semiconductor memory devices 2111 and 2112 through one common channel CH. In FIG. 10, it is illustrated that the two semiconductor memory devices 2111 and 2112 are provided to the channel CH. However, this is for illustrative purposes, and it will be understood that a greater number of semiconductor memory devices may be provided to the channel CH.

Figure 11:
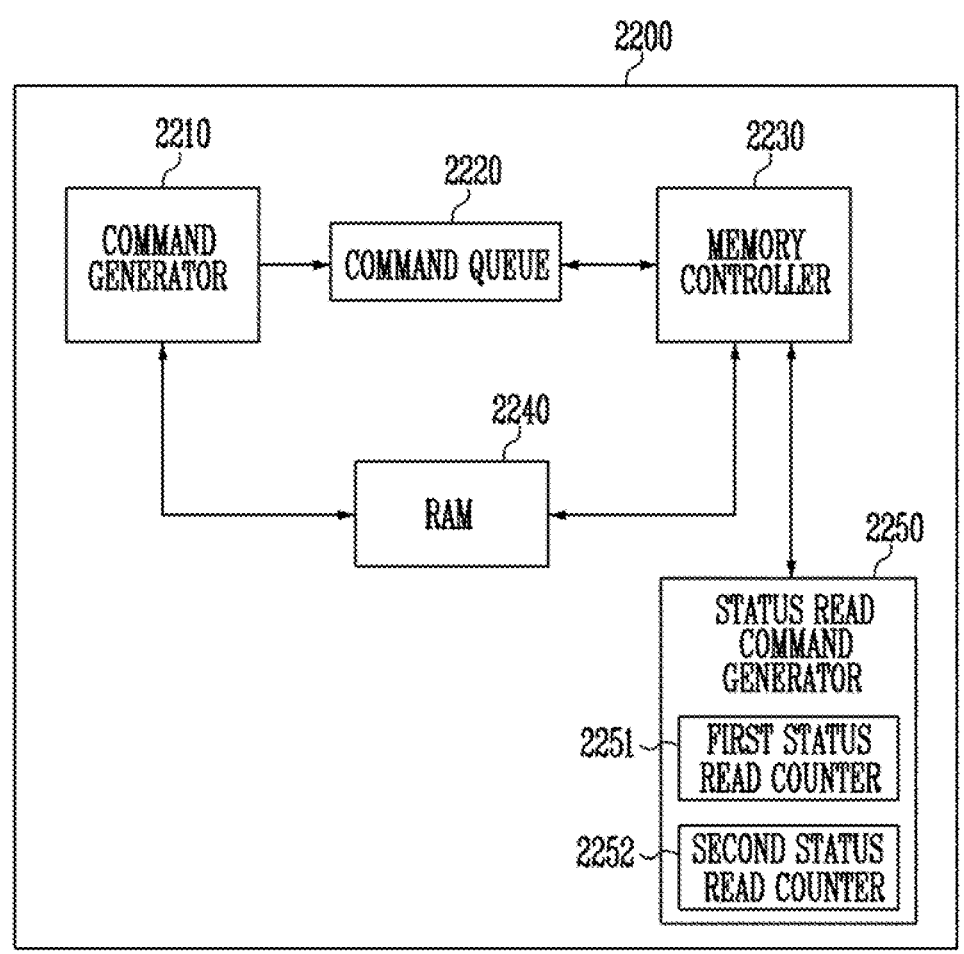
FIG. 11 is a block diagram illustrating a controller of FIG. 10.
Figure 12:
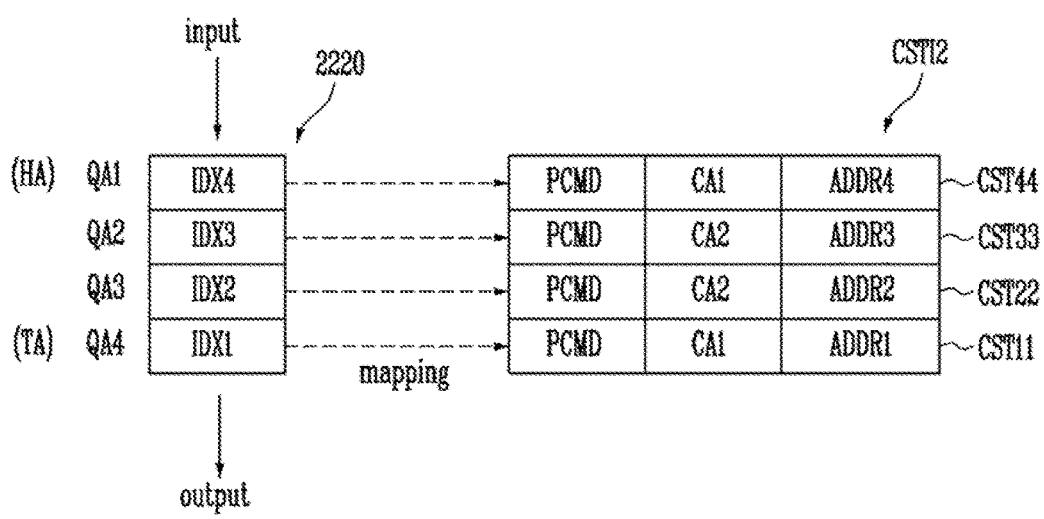
FIG. 12 is a diagram illustrating indexes stored in a command queue and command set information stored in a RAM of FIG. 10.

FIG. 11 is a block diagram illustrating the controller 2200 of FIG. 10. FIG. 12 is a diagram illustrating indexes stored in a command queue and command set information stored in a RAM of FIG. 10.

Referring to FIG. 11, the controller 2200 includes a command generator 2210, the command queue 2220, a memory controller 2230, a RAM 2240, and a status read command generator 2250.

Subsequently, referring to FIG. 12, first to fourth indexes IDX1 to IDX4 are stored in first to fourth queue addresses QA1 to QA4 of the command queue 2220. The first to fourth indexes IDX1 to IDX4 are sequentially input to the command queue 2220. The first queue address QA1 is a head address HA. The fourth queue address QA4 is a tail address TA.

In FIG. 12, it is illustrated that the four indexes IDX1 to IDX4 are stored in the command queue 2220. However, it will be understood that a greater number of indexes may be stored in the command queue 2220. Each index may represent an address in the RAM 2240 in which a corresponding command set. First to fourth command sets CST11 to CST44 of the command set information CSTI2 are mapped to the first to fourth indexes IDX1 to IDX4, respectively.

Each of the first to fourth command sets CST11 to CST44 includes a program command PCMD. The first to fourth command sets CST11 to CST44 include first to fourth addresses ADDR1 to ADDR 4.

Since the plurality of memory devices 2111 and 2112 are connected to the one common channel CH, each command set additionally includes a chip address. In FIG. 12, it is illustrated that the first and fourth command sets CST11 and CST44 include a first chip address CA1 indicating the first semiconductor memory device 2111. In FIG. 12, it is illustrated that the second and third command sets CST22 and CST33 include a second chip address CA2 indicating the second semiconductor memory device 2112.

When each of the first and fourth command sets CST11 and CST44 is transmitted through the channel CH, the first semiconductor memory device 2111 may acquire a corresponding command set with reference to the first chip address CA1. When each of the second and third command sets CST22 and CST33 is transmitted through the channel CH, the second semiconductor memory device 2112 may acquire a corresponding command set with reference to the second chip address CA2.

Referring back to FIG. 11, the status read command generator 2250 includes a plurality of status read counters 2251 and 2252. The number of the status read counters 2251 and 2252 may be equal to that of the semiconductor memory devices 2111 and 2112. The first and second status read counters 2251 and 2252 correspond to the first and second semiconductor memory devices 2111 and 2112.

Figure 13:
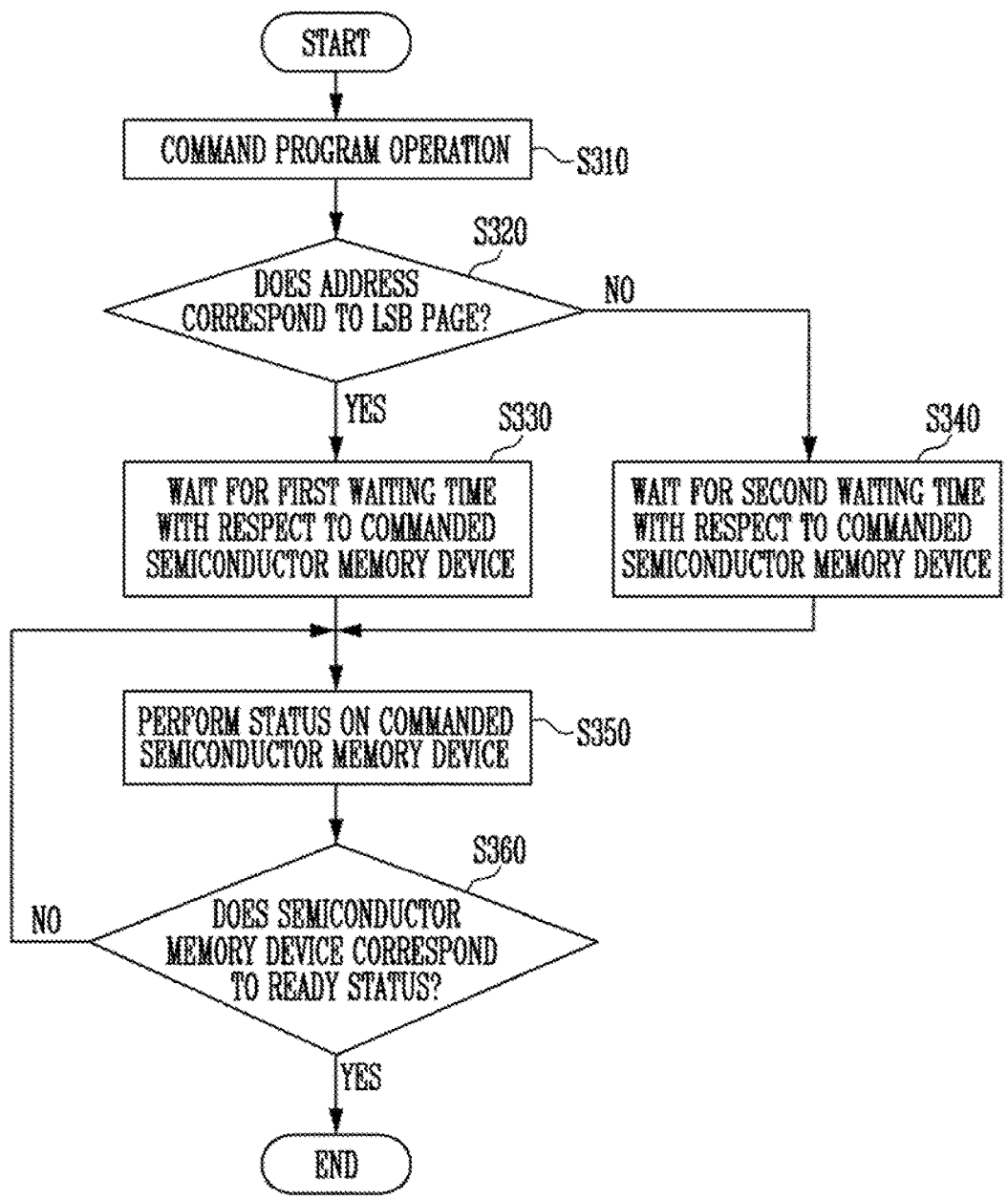
FIG. 13 is a flowchart illustrating an operating method of the controller according to an embodiment of the present disclosure.

FIG. 13 is a flowchart illustrating an operating method of the controller 2200 according to an embodiment of the present disclosure.

Referring to FIG. 13, at step S310, the controller 2200 commands a program operation. The memory controller 2230 may command the program operation to the first semiconductor memory device 2111 and the second semiconductor memory device 2112 by transmitting a command set through the channel CH.

At step S320, the controller 2200 determines whether an address included in the command set corresponds to the LSB page or the MSB page. The status read command generator 2250 may acquire the address included in the command set, and determine whether the acquired address corresponds to the LSB page or the MSB page. When the address included in the command set corresponds to the LSB page, step S330 is performed. When the address included in the command set corresponds to the MSB page, step S340 is performed.

At step S330, the controller 2200 waits for the first waiting time with respect to the commanded semiconductor memory device. The status read command generator 2250 acquires the chip address included in the command set, and selects one of the first and second status read counters 2251 and 2252 according to the chip address. When the first chip address CA1 is acquired, the first status read counter 2251 may be selected. When the second chip address CA2 is acquired, the second status read counter 2252 may be selected. In addition, the status read command generator 2250 may set the value of the selected status read counter to the first reference value. The selected status read counter may count up to the first reference value and then generate the alarm signal.

At step S340, the controller 2200 waits for the second waiting time with respect to the commanded semiconductor memory device. The status read command generator 2250 may set the value of the selected status read counter to the second reference value. The selected status read counter may count up to the second reference value and then generate an alarm signal.

At step S350, the controller 2200 performs status read operation on the commanded semiconductor memory device. At step S360, it is determined whether the semiconductor memory device corresponds to the ready status as a result of the status read operation. Steps S350 and S360 are repeated until the result of the status read operation corresponds to the ready status.

The program operation may be commanded to the first semiconductor memory device 2111, and the controller 2200 may wait for a waiting time with respect to the first semiconductor memory device 2111. In this case, the waiting time of the first semiconductor memory device 2111 may be determined by the first status read counter 2251. In parallel to the program operation of the first semiconductor memory device 2111, the program operation may be commanded to the second semiconductor memory device 2112. In this case, the waiting time of the second semiconductor memory device 2112 may be determined by the second status read counter 2252.

Figure 14:
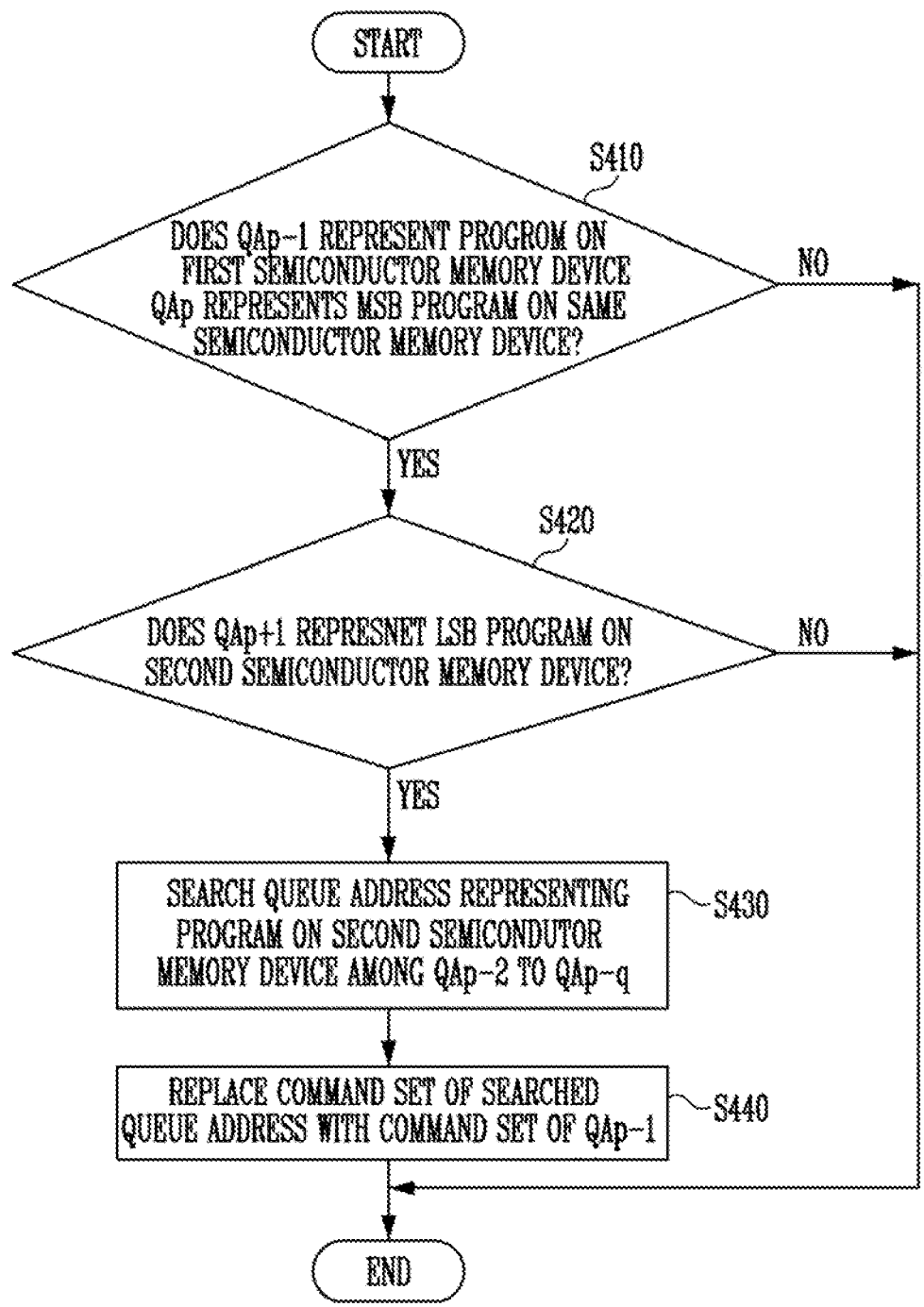
FIG. 14 is a flowchart illustrating a method of re-ordering indexes stored in the command queue.

FIG. 14 is a flowchart illustrating a method of re-ordering the indexes IDX1 to IDX4 stored in the command queue 2220.

According to the embodiment of the present disclosure, the memory controller 2230 may re-order the indexes IDX1 to IDX4 stored in the command queue 2220 in order to reduce idle time of the semiconductor memory devices 2111 and 2112 and thus in order to improve operation speed of the memory system.

Referring to FIG. 14, at step S410, when the command set of a pth queue address QAp represents the MSB program on any one semiconductor memory device (e.g., the first semiconductor memory device) the memory controller 2230 determines whether the command set of a (p−1)th queue address QAp−1 represents the LSB program on the same semiconductor memory device. If so, step S420 is performed.

The command queue 2220 inputs/outputs data on the FIFO basis. When the command sets of the pth queue address QAp and the (p−1)th queue address QAp−1 correspond to the first semiconductor memory device means that program operations are consecutively are commanded to the first semiconductor memory device.

Since the command set of the pth queue address QAp represents the MSB program, the time OP2 required for the first semiconductor memory device to process the command set of the pth queue address QAp or the MSB program operation time is long. If the command set of the (p−1)th queue address QAp−1 also corresponds to the first semiconductor memory device, the command set of the (p−1)th queue address QAp−1 may not be output during the long access time to the MSB program operation, which is the sum of the second waiting time WT2 and the second status read period SRT2, even though another semiconductor memory device (e.g., the second memory device) connected to the same channel as the first semiconductor memory device corresponds to the ready status.

At step S420, the memory controller 2230 determines whether the command set of a (p+1)th queue address QAp+1 represents the LSB program on the second semiconductor memory device. If so, step S430 is performed.

Since the command set of the (p+1)th queue address QAp+1 represents the LSB program, the time OP1 required for the second semiconductor memory device to process the command set of the (p+1)th queue address QAp+1 or the LSB program operation time is relatively short. That is, when the command set of the (p+1)th queue address QAp+1 and the command set of the pth queue address QAp are transmitted to the first and second semiconductor memory devices, respectively, the second memory device performs the LSB operation in response to the command set of the (p+1)th queue address QAp+1 within the short LSB program operation time. On the other hand, the first semiconductor memory device maintains the busy status for the long MSB program operation time for the command set of the pth queue address QAp.

At step S430, the memory controller 2230 searches a queue address representing the program on the second semiconductor memory device among a (p−2)th queue address QAp−2 to a (p−q)th queue address QAp−q. At step S440, the command set of the searched queue address is replaced with the command set of the (p−1)th queue address QAp−1. Steps S430 and S440 allow the second semiconductor memory device to perform the program operation in response to the replaced command set of the (p−1)th queue address QAp−1 while the first semiconductor memory device maintains the busy status for the long MSB program operation time for the command set of the pth queue address QAp.

Figure 15:
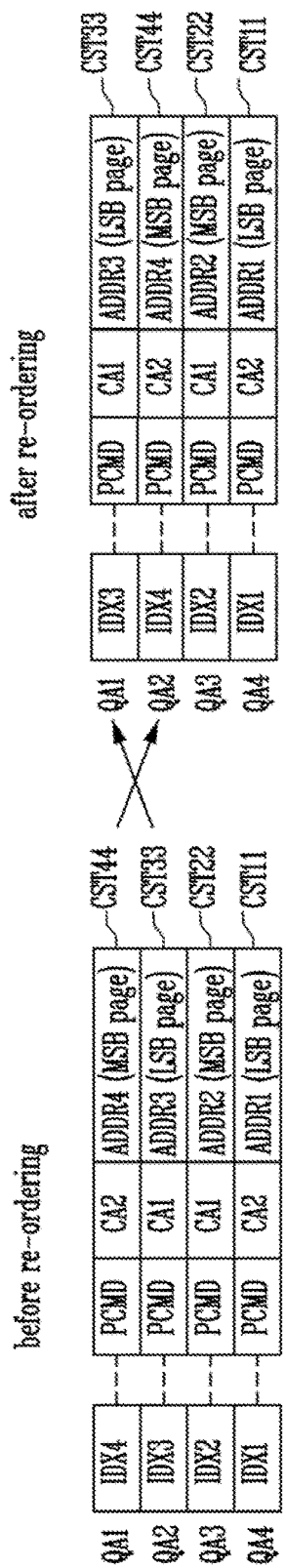
FIG. 15 is a diagram illustrating the re-ordering of indexes of FIG. 14.

FIG. 15 is a diagram illustrating the re-ordering of indexes of FIG. 14.

Referring to FIG. 15, before the re-ordering, first to fourth indexes IDX1 to IDX4 are stored in first to fourth queue addresses QA1 to QA4, respectively. The first to fourth indexes IDX1 to IDX4 correspond to first to fourth command sets CST11 to CST44. In FIG. 15, the first and fourth command sets CST11 and CST44 have a second chip address CA2, and the second and third command sets CST22 and CST33 have a first chip address CA1. In FIG. 15, it is assumed that addresses ADDR1 and ADDR3 of the first and third command sets CST11 and CST33 indicate the LSB page, and addresses ADDR2 and ADDR4 of the second and fourth command sets CST22 and CST44 indicate the MSB page.

The memory controller 2230 performs step S410. The command set CST22 of the third queue address QA3 represents the MSB program on the first semiconductor memory device, and the command set CST33 of the second queue address QA2 represents the LSB program on the same semiconductor memory device. The time required for the first semiconductor memory device to process the command set CST22 of the third queue address QA2 may be the MSB program operation time, which is relatively long. In this case, the command set CST33 of the second queue address QA2 also corresponds to the first semiconductor memory device, and therefore, the command set CST33 of the second queue address QA2 may not be output during the long access time to the MSB program operation, which is the sum of the second waiting time WT2 and the second status read period SRT2, even though the second memory device corresponds to the ready status.

The memory controller 2230 performs step S420. The command set CST11 of the fourth queue address QA4 represents the LSB program on the second semiconductor memory device. The second semiconductor memory device may perform the LSB program operation in response to the command set of the (p+1)th queue address QAp+1 within the short LSB program operation time.

The memory controller 2230 performs steps S430 and S440. The command set CST44 of the first queue address QA1 represents a program on the second semiconductor memory device. Thus, the command set CST33 of the second queue address QA2 is replaced with the command set CST44 of the first queue address QA1. While the first semiconductor memory device processes the second command set CST22, the second semiconductor memory device may receive and process the fourth command set CST44. Accordingly, it is possible to provide efficient interleaving between the first and second semiconductor memory devices. Thus, the operation speed of the memory system can be improved.

Figure 16:
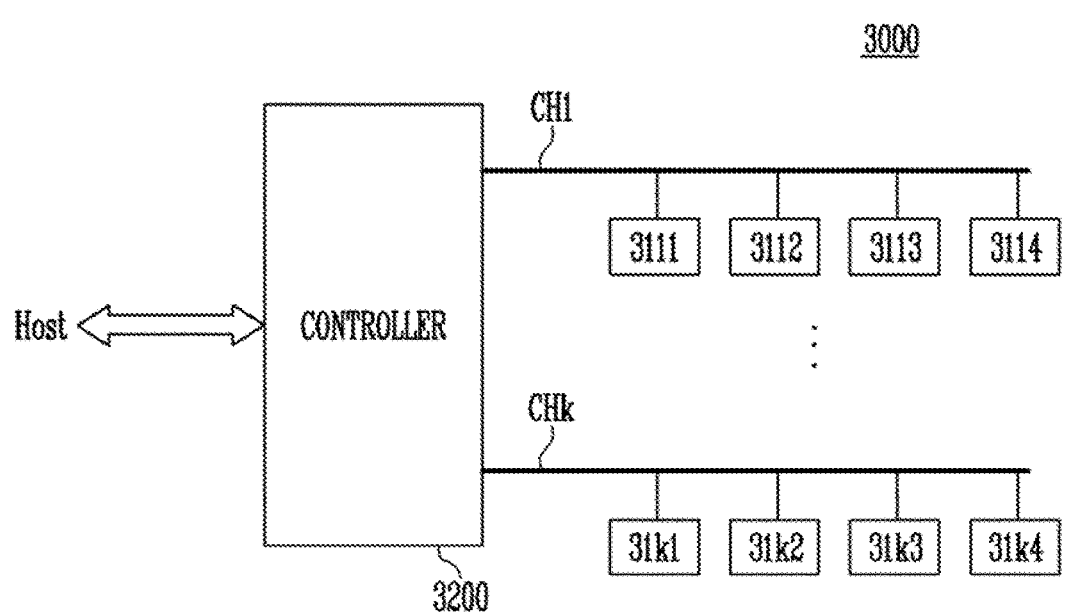
FIG. 16 is a block diagram illustrating a memory system according to an embodiment of the present disclosure.

FIG. 16 is a block diagram illustrating a memory system according to an embodiment of the present disclosure.

Referring to FIG. 16, the memory system 3000 includes a plurality of semiconductor memory devices 3111 to 3114 and 31k1 to 31k4 and a controller 3200.

Each of the plurality of semiconductor memory devices 3111 to 3114 and 31k1 to 31k4 may be similar to the semiconductor memory device 100 described with reference to FIG. 2.

The plurality of semiconductor memory devices 3111 to 3114 and 31k1 to 31k4 are divided into first to kth memory groups. The controller 3200 may control the first to kth memory groups through first to kth channels CH1 to CHk, respectively.

Figure 17:
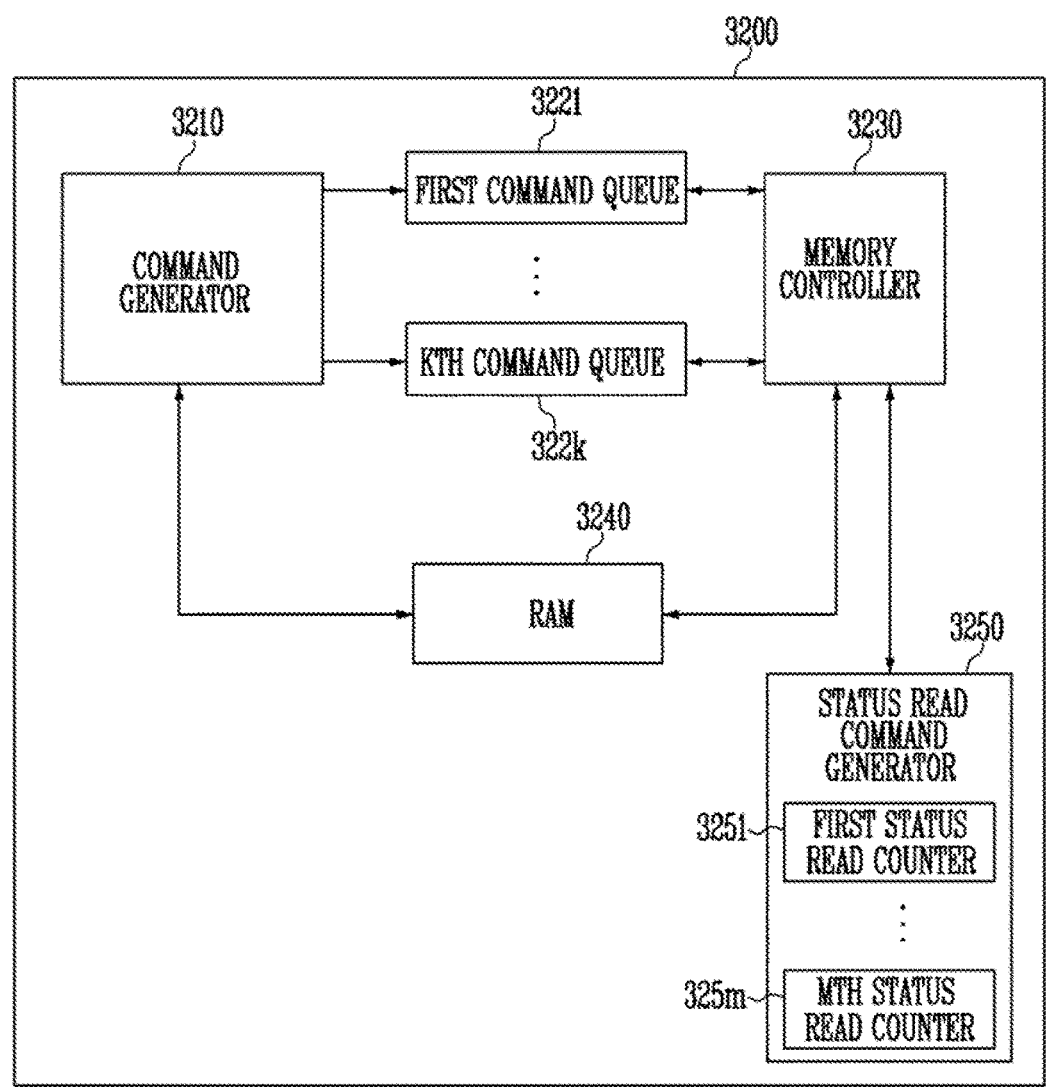
FIG. 17 is a block diagram illustrating a controller of FIG. 16.

FIG. 17 is a block diagram illustrating the controller 3200 of FIG. 16.

Referring to FIG. 17, the controller 3200 includes a command generator 3210, first to kth command queues 3221 to 322k, a memory controller 3230, a RAM 3240, and a status read command generator 3250.

The first to kth command queues 3221 to 322k correspond to first to kth channels CH1 to CHk. The command generator 3210 may queue indexes in the first to kth command queues 3221 to 322k, and store, in the RAM 3240, command sets corresponding to the respective indexes. The memory controller 3230 may dequeue indexes in the first to kth command queues 3221 to 322k, and read, from the RAM 3240, command sets corresponding to the respective indexes. The memory controller 3230 may transmit the command sets of the first to kth command queues 3221 to 322k to the respective first the kth channels CH1 to CHk.

The status read command generator 3250 includes a plurality of status read counters 3251 to 325m. The number of the status read counters 3251 to 325m may be equal to that of the semiconductor memory devices 3111 to 3114 and 31k1 to 31k4. The status read counters 3251 to 325m may correspond to the semiconductor memory devices 3111 to 3114 and 31k1 to 31k4, respectively. Each status read counter may be provided to determine a waiting time for a corresponding semiconductor memory device.

According to the embodiment of the present disclosure, when the address for the program operation indicates the LSB page, a short waiting time is applied before the status read operation is performed. When the address for the program operation indicates the MSB page, a long waiting time is applied before the status read operation is performed. Accordingly, the amount of load where the status read operation has influence on the throughput of the controller can be reduced, and the power consumption of the memory system can be reduced.

According to the present disclosure, the operation speed of the memory system can be improved, and the power consumption of the memory system can be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of operating a controller for controlling a semiconductor memory device including a plurality of pages, the method comprising:
   determining whether an address corresponding to a program operation indicates a lower page or an upper page;
   waiting for a first waiting time for the program operation to the lower page when the address indicates the lower page;
   waiting for a second waiting time for the program operation to the upper page when the address indicates the upper page, wherein the second waiting time is longer than the first waiting time; and
   performing a status read operation on the semiconductor memory device after one of the first waiting time or the second waiting time,
   wherein the status read operation includes:
      transmitting a status read command to the semiconductor memory device;
      receiving, from the semiconductor memory device, a status read response signal as a response to the status read command;
      re-performing the status read operation when the status read response signal represents that the semiconductor memory device corresponds to a busy status; and
      accessing the semiconductor memory device in response to another command when the status read response signal represents that the semiconductor memory device corresponds to a ready status.

2. The method of claim 1, wherein the second waiting time is equal to or shorter than a time required for the program operation to the upper page and longer than a time required for the program operation to the lower page.

3. The method of claim 1, wherein the first waiting time is equal to or shorter than a time required for the program operation to the lower page.

4. The method of claim 1,
wherein the address includes a block address and one page address among a plurality of page addresses, and
wherein it is determined that, when the page address is a minimum value among the plurality of page addresses, the address indicates the lower page.

5. The method of claim 1,
wherein the address includes a block address and one page address among a plurality of page addresses, and
wherein it is determined that, when the page address is a maximum value among the plurality of page addresses, the address indicates the upper page.

6. The method of claim 1,
wherein the address includes a block address and one page address among a plurality of page addresses, and
wherein an odd numbered address indicates the lower page.

7. The method of claim 1,
wherein the address includes a block address and one page address among a plurality of page addresses, and
wherein an even numbered address indicates the upper page.

8. The method of claim 1,
wherein each memory cell included in the pages is a multi-level cell (MLC), and
wherein the lower page is a least significant bit (LSB) page, and the upper page is a most significant bit (MSB) page.

9. A memory system comprising:
a semiconductor memory device including a plurality of pages; and
a controller including:
a memory controller suitable for commanding a program operation on the semiconductor memory device; and
a status read command generator suitable for:
waiting for a first waiting time for the program operation to the lower page when an address corresponding to the program operation indicates the lower page;
waiting for a second waiting time for the program operation to the upper page when the address indicates the upper page, wherein the second waiting time is longer than the first waiting time; and
performing a status read operation on the semiconductor memory device after one of the first waiting time or the second waiting time,
wherein the status read operation includes:
transmitting a status read command to the semiconductor memory device;
receiving, from the semiconductor memory device, a status read response signal as a response to the status read command;
re-performing the status read operation when the status read response signal represents that the semiconductor memory device corresponds to a busy status; and
accessing the semiconductor memory device in response to another command when the status read response signal represents that the semiconductor memory device corresponds to a ready status.

10. The memory system of claim 9,
further comprising a status read counter suitable for counting,
wherein the status read command generator sets a value of the status read counter to a first reference value when the address indicates the lower page, and sets the value of the status read counter to a second reference value greater than the first reference value when the address indicates the upper page,
wherein the status read counter counts up to the first reference value or the second reference value from a time point when the program operation is commanded, and then generates an alarm signal, and
wherein the status read command generator performs the status read operation in response to the alarm signal.

11. The memory system of claim 9, wherein the status read command generator repeatedly performs the status read operation until a result of the status read operation represents that the semiconductor memory device corresponds to a ready status.

12. The memory system of claim 9,
wherein the address includes a block address and one page address among a plurality of page addresses, and
wherein it is determined that, when the page address is a minimum value among the plurality of page addresses, the address indicates the lower page.

13. The memory system of claim 9,
wherein the address includes a block address and one page address among a plurality of page addresses, and
wherein it is determined that, when the page address is a maximum value among the plurality of page addresses, the address indicates the upper page.

14. The memory system of claim 9,
wherein the address includes a block address and one page address among a plurality of page addresses, and
wherein an odd numbered address indicates the lower page.

15. The memory system of claim 9,
wherein the address includes a block address and one page address among a plurality of page addresses, and
wherein an even numbered address indicates the upper page.

16. A memory system comprising:
first and second memory devices connected to one channel among a plurality of channels, the first and second memory devices each including a plurality of pages; and
a controller including:
a memory controller suitable for commanding first and second program operations on the first and second semiconductor memory devices, respectively; and
a status read command generator suitable for:
waiting for a first waiting time for the first program operation to the lower page when a first address corresponding to the first program operation indicates the lower page;
waiting for a second waiting time for the first program operation to the upper page when the first address indicates the upper page, wherein the second waiting time is longer than the first waiting time;
performing a status read operation on the first semiconductor memory device after one of the first and second waiting times for the first program operation;
waiting for the first waiting time for the second program operation to the lower page when a second address corresponding to the second program operation indicates the lower page;
waiting for the second waiting time for the second program operation to the upper page when the second address indicates the upper page; and performing the status read operation on the second semiconductor memory device after one of the first or second waiting times for the second program operation, wherein the status read operation includes:
- transmitting the status read command to the semiconductor memory device;
- receiving, from the semiconductor memory device, a status read response signal as a response to the status read command;
- re-performing the status read operation when the status read response signal represents that the semiconductor memory device corresponds to a busy status; and
- accessing the semiconductor memory device in response to another command when the status read response signal represents that the semiconductor memory device corresponds to a ready status.

17. The memory system of claim 16, wherein the controller further includes:
- a command generator suitable for generating commands for the first and second program operations including the first and second addresses, respectively; and
- a RAM suitable for buffering the commands for the first and second program operations on the first-in-first-out (FIFO) basis,
- wherein the memory controller commands the first and second program operations according to the commands for the first and second program operations buffered in the RAM.

18. The memory system of claim 17, wherein the memory controller re-orders the buffered commands in the RAM such that the memory controller alternately commands the first and second program operations.

* * * * *